United States Patent
Oie et al.

(10) Patent No.: US 10,160,938 B2
(45) Date of Patent: Dec. 25, 2018

(54) SEMICONDUCTOR ELEMENT CLEANING SOLUTION THAT SUPPRESSES DAMAGE TO TANTALUM-CONTAINING MATERIALS, AND CLEANING METHOD USING SAME

(71) Applicant: MITSUBISHI GAS CHEMICAL COMPANY, INC., Chiyoda-ku (JP)

(72) Inventors: Toshiyuki Oie, Tokyo (JP); Kenji Shimada, Tokyo (JP)

(73) Assignee: MITSUBISHI GAS CHEMICAL COMPANY, INC., Chiyoda-ku (JP)

(*) Notice: Subject to any disclaimer, the term of this patent is extended or adjusted under 35 U.S.C. 154(b) by 0 days.

(21) Appl. No.: 15/502,659

(22) PCT Filed: Oct. 2, 2015

(86) PCT No.: PCT/JP2015/078076
§ 371 (c)(1),
(2) Date: Feb. 8, 2017

(87) PCT Pub. No.: WO2016/076032
PCT Pub. Date: May 19, 2016

(65) Prior Publication Data
US 2017/0233687 A1  Aug. 17, 2017

(30) Foreign Application Priority Data
Nov. 13, 2014 (JP) .................... 2014-230635

(51) Int. Cl.
*C11D 7/26* (2006.01)
*C11D 11/00* (2006.01)
(Continued)

(52) U.S. Cl.
CPC ........... *C11D 11/0047* (2013.01); *C11D 7/04* (2013.01); *C11D 7/06* (2013.01); *C11D 7/10* (2013.01);
(Continued)

(58) Field of Classification Search
CPC .......... C11D 11/0047; C11D 7/10; C11D 7/06
(Continued)

(56) References Cited

U.S. PATENT DOCUMENTS

| 8,324,116 B2* | 12/2012 | Vos ................. H01L 21/0206 257/E21.19 |
| 2003/0148624 A1* | 8/2003 | Ikemoto ................. G03F 7/423 438/714 |

(Continued)

FOREIGN PATENT DOCUMENTS

| EP | 3 220 408 A1 | 9/2017 |
| EP | 3 220 409 A1 | 9/2017 |

(Continued)

OTHER PUBLICATIONS

International Search Report dated Nov. 17, 2015 in PCT/JP2015/078076 filed Oct. 2, 2015.

*Primary Examiner* — Gregory E Webb
(74) *Attorney, Agent, or Firm* — Oblon, McClelland, Maier & Neustadt, L.L.P.

(57) ABSTRACT

According to the present invention, it is possible to provide a cleaning method for removing a photoresist and dry etching residue on a surface of a semiconductor element having a low-k film and a material that contains 10 atom % or more of tantalum, wherein the cleaning method is characterized by using a cleaning solution that contains 0.002-50 mass % of hydrogen peroxide, 0.001-1 mass % of an alkaline earth metal compound, an alkali, and water.

16 Claims, 1 Drawing Sheet

(51) Int. Cl.
*C11D 7/04* (2006.01)
*C11D 17/08* (2006.01)
*G03F 7/42* (2006.01)
*C11D 7/06* (2006.01)
*C11D 7/10* (2006.01)
*C11D 7/32* (2006.01)
*H01L 21/02* (2006.01)
*H01L 21/311* (2006.01)

(52) U.S. Cl.
CPC ............ *C11D 7/105* (2013.01); *C11D 7/3209* (2013.01); *C11D 17/08* (2013.01); *G03F 7/42* (2013.01); *H01L 21/0206* (2013.01); *H01L 21/02063* (2013.01); *H01L 21/31133* (2013.01)

(58) Field of Classification Search
USPC .................................................. 510/175, 176
See application file for complete search history.

(56) References Cited

U.S. PATENT DOCUMENTS

2010/0317185 A1* 12/2010 Vos ..................... H01L 21/0206
438/591
2012/0108485 A1* 5/2012 Kamimura ........... C11D 3/0094
510/176

FOREIGN PATENT DOCUMENTS

| JP | 2003-330205 A | 11/2003 |
|---|---|---|
| JP | 2007-510307 A | 4/2007 |
| JP | 2009-69505 A | 4/2009 |
| WO | WO 2005/043245 A2 | 5/2005 |

* cited by examiner

[FIG. 1]
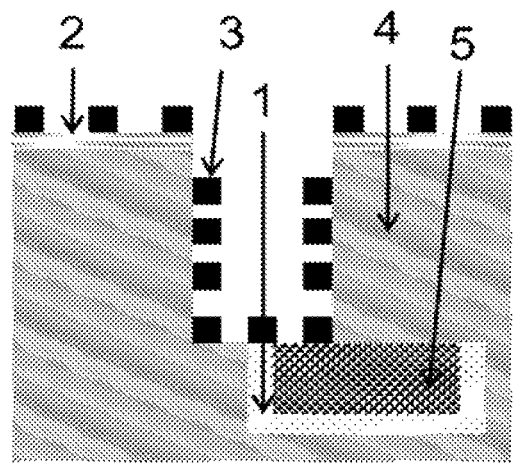
[FIG. 2]
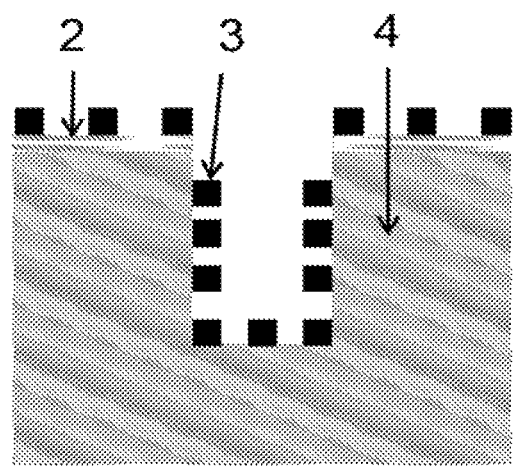

SEMICONDUCTOR ELEMENT CLEANING SOLUTION THAT SUPPRESSES DAMAGE TO TANTALUM-CONTAINING MATERIALS, AND CLEANING METHOD USING SAME

TECHNICAL FIELD

The present invention relates to a cleaning solution, which suppresses damage to a low dielectric constant film and a tantalum-containing material and removes a photoresist and dry etching residue on a surface of a product to be treated in the process for manufacturing a semiconductor element, and a cleaning method using the same.

BACKGROUND ART

The production of a highly integrated semiconductor element generally has a series of processes as follows: a conductive thin film such as a metal film as a conductive wiring material and an interlayer dielectric film for insulation between conductive thin films are formed on an element such as a silicon wafer; after that, a photoresist is uniformly applied to the surface thereof to provide a photosensitive layer, and this is subjected to the selective exposure/development treatment to form a desired photoresist pattern; then the dry etching treatment is applied to the interlayer dielectric film using the photoresist pattern as a mask to form a desired pattern on the thin film; and then the photoresist pattern, residue generated by the dry etching treatment (hereinafter referred to as "dry etching residue"), etc. are completely removed by ashing with oxygen plasma, cleaning with a cleaning solution or the like.

Recently, the miniaturization of design rules has been accelerated, and the limit of high-speed arithmetic processing has been gradually controlled by signal transmission delay. For this reason, the conductive wiring material has been changed from aluminium to copper which has lower electrical resistance, and the interlayer dielectric film has been changed from a silicone oxide film to a low dielectric constant film (a film having a dielectric constant of less than 3, hereinafter referred to as "low-k film"). Adhesion of copper to the interlayer dielectric film is insufficient, and when copper is brought into contact with the interlayer dielectric film, copper is dispersed in the interlayer dielectric film over time. In order to improve these matters, a method for inserting a film made of a material containing tantalum which is called a "barrier metal" between copper and the interlayer dielectric film is generally employed. In addition, with the miniaturization of design rules, the constitution of the gate of the transistor has been gradually changed from a combination of silicon oxide and polycrystalline silicon to a combination of a high dielectric constant material and a metal. There is a case where a tantalum-containing material is used as this metal.

When a photoresist and dry etching residue are removed with oxygen plasma, there is a problem that a low-k film is damaged due to exposure to oxygen plasma or the like, resulting in significant deterioration of electrical characteristics. In addition, the tantalum-containing material is damaged due to exposure to oxygen plasma or the like, resulting in problems in production processes after that. For this reason, in the production of a semiconductor element using a low-k film and a tantalum-containing material (FIG. 1), it is desired to suppress damage to the low-k film and the tantalum-containing material while removing a photoresist and dry etching residue at a level comparable to that of an oxygen plasma process.

Regarding the treatment with a cleaning solution, it is known that a photoresist and dry etching residue can be removed by using a hydrogen peroxide-containing strong alkaline cleaning solution. The hydrogen peroxide-containing strong alkaline cleaning solution is excellent in removability of the photoresist and dry etching residue, but when the cleaning solution is brought into contact with a tantalum-containing material, it is significantly damaged. Under such circumstances, it is desired to develop a hydrogen peroxide-containing strong alkaline cleaning solution capable of effectively removing a photoresist and dry etching residue without damage to a tantalum-containing material and a cleaning method using the same.

Patent Document 1 proposes a wiring forming method using a cleaning solution containing an alkali and WzMXy (in the formula: M represents a metal selected from the group consisting of Si, Ge, Sn, Pt, P, B, Au, Ir, Os, Cr, Ti, Zr, Rh, Ru and Sb; X represents a halide selected from the group consisting of F, Cl, Br and I; W is selected from H, an alkali or alkaline earth metal, and a metal-ion-free hydroxide base moiety; y represents a number of from 4 to 6 depending on a metal halide; and z represents a number of 1, 2 or 3). By the cleaning method described in Patent Document 1, a photoresist cannot be removed, and damage to a low-k film cannot be suppressed. Therefore, it cannot be used for the above-described purpose (see Comparative Example 8). Further, a cleaning solution, in which WzMXy described in Patent Document 1 is blended in the cleaning solution to be used in the cleaning method of the present invention instead of the alkaline earth metal compound that is blended for the purpose of suppressing damage to the tantalum-containing material, damages the tantalum-containing material and the low-k film (see Comparative Example 9).

PRIOR ART DOCUMENTS

Patent Documents

Patent Document 1: Japanese National-phase PCT Laid-Open Patent Publication No. 2007-510307

SUMMARY OF THE INVENTION

Problems to be Solved by the Invention

The purpose of the present invention is to provide: a cleaning solution, which suppresses damage to a low dielectric constant film and a tantalum-containing material and removes a photoresist and dry etching residue on a surface of a product to be treated in the process for manufacturing a semiconductor element; and a cleaning method using the same.

Means for Solving the Problems

The above-described problems can be solved by the present invention. Specifically, the present invention is as follows:

<1> A cleaning method for removing a photoresist and dry etching residue on a surface of a semiconductor element having a low-k film and a material that contains 10 atomic % or more of tantalum, wherein the cleaning method is characterized by using a cleaning solution that contains 0.002 to 50% by mass of hydrogen peroxide, 0.001 to 1% by mass of an alkaline earth metal compound, an alkali, and water.

<2> The cleaning method according to item <1>, wherein the pH value of the cleaning solution is 7 to 14.
<3> The cleaning method according to item <1> or <2>, wherein the material that contains 10 atomic % or more of tantalum is at least one substance selected from the group consisting of tantalum oxide, tantalum nitride and tantalum.
<4> The cleaning method according to any one of items <1> to <3>, wherein the alkaline earth metal compound is at least one substance selected from the group consisting of a calcium compound, a strontium compound and a barium compound.
<5> The cleaning method according to any one of items <1> to <4>, wherein the content of the alkali is 0.1 to 20% by mass.
<6> The cleaning method according to any one of items <1> to <5>, wherein the alkali is at least one substance selected from the group consisting of potassium hydroxide, potassium acetate, potassium carbonate, potassium phosphate, ammonia, tetramethylammonium hydroxide, triethylamine, ethanolamine and 1-amino-2-propanol.
<7> A cleaning solution which removes a photoresist and dry etching residue on a surface of a semiconductor element having a low-k film and a material that contains 10 atomic % or more of tantalum, wherein the cleaning solution contains 0.002 to 50% by mass of hydrogen peroxide, 0.001 to 1% by mass of an alkaline earth metal compound, an alkali, and water.
<8> The cleaning solution according to item <7>, wherein the pH value of the cleaning solution is 7 to 14.
<9> The cleaning solution according to item <7> or <8>, wherein the material that contains 10 atomic % or more of tantalum is at least one substance selected from the group consisting of tantalum oxide, tantalum nitride and tantalum.
<10> The cleaning solution according to any one of items <7> to <9>, wherein the alkaline earth metal compound is at least one substance selected from the group consisting of a calcium compound, a strontium compound and a barium compound.
<11> The cleaning solution according to any one of items <7> to <10>, wherein the content of the alkali is 0.1 to 20% by mass.
<12> The cleaning solution according to any one of items <7> to <11>, wherein the alkali is at least one substance selected from the group consisting of potassium hydroxide, potassium acetate, potassium carbonate, potassium phosphate, ammonia, tetramethylammonium hydroxide, triethylamine, ethanolamine and 1-amino-2-propanol.

Advantageous Effect of the Invention

By employing the cleaning solution of the present invention and the cleaning method using the same, it is possible to suppress damage to a low-k film and a tantalum-containing material and selectively remove a photoresist and dry etching residue on a surface of a product to be treated in the process for manufacturing a semiconductor element, and it is possible to produce a semiconductor element having high precision and high quality with a high yield.

BRIEF DESCRIPTION OF THE DRAWINGS

FIG. 1 is a schematic cross sectional view showing an example of the structure of a semiconductor element including copper and tantalum that is a barrier metal for copper prior to removal of a photoresist and dry etching residue.

FIG. 2 is a schematic cross sectional view showing an example of a semiconductor element prior to removal of a photoresist and dry etching residue.

EMBODIMENTS FOR CARRYING OUT THE INVENTION

The cleaning solution of the present invention and the cleaning method using the same are used in the cleaning process in the production of a semiconductor element, and in this case, a photoresist and dry etching residue can be cleaned/removed at a quite satisfactory level, and it is possible to suppress damage to a low-k film and a tantalum-containing material.

The tantalum-containing material included in the semiconductor element to which the cleaning solution of the present invention is applied is a material containing 10 atomic % or more of tantalum, and the atomic composition percentage of tantalum is preferably 15 atomic % or more, more preferably 20 atomic % or more, even more preferably 25 atomic % or more, and particularly preferably 30 atomic % or more. Specific examples of the tantalum-containing material include tantalum oxide, tantalum nitride and tantalum. However, the tantalum-containing material is not limited thereto as long as it is a material containing 10 atomic % or more of tantalum.

In the present invention, the content of tantalum can be examined by measuring the constituent ratio of tantalum atoms in the targeted tantalum-containing material according to the ion sputtering method of X-ray photoelectron spectroscopy (XPS). The vicinity of the surface of the tantalum-containing material is oxidized, and therefore the constituent ratio of oxygen atoms therein may be higher than that in the inner part of the material. For this reason, the surface of the tantalum-containing material is etched by ion sputtering until the constituent ratio of tantalum atoms and oxygen atoms becomes constant, thereby measuring the constituent ratio of tantalum atoms in the inner portion of the tantalum-containing material exposed by ion sputtering. As a measurement apparatus, a fully automatic XPS analyzer K-Alpha (manufactured by Thermo Fisher Scientific Inc.) can be used.

The concentration of the alkaline earth metal compound contained in the cleaning solution of the present invention is 0.001 to 1% by mass, preferably 0.002 to 0.5% by mass, even more preferably 0.003 to 0.2% by mass, and particularly preferably 0.005 to 0.1% by mass. When the concentration is within the above-described range, corrosion of the tantalum-containing material can be effectively prevented. When the concentration exceeds 1% by mass, removability of dry etching residue may be reduced.

The present inventors found for the first time that the alkaline earth metal compound contained in the cleaning solution exerts anticorrosive effects on the tantalum-containing material. The mechanism thereof has not been elucidated, but it is considered that the alkaline earth metal compound adsorbs to the surface of tantalum, thereby preventing corrosion of tantalum caused by hydrogen peroxide or alkali contained in the cleaning solution.

Specific examples of the alkaline earth metal compound include a calcium compound, a strontium compound and a barium compound. More specific examples thereof include, but are not limited to, barium nitrate, barium hydroxide, barium chloride, barium acetate, barium oxide, barium bromide, barium carbonate, barium fluoride, barium iodide, barium sulfate, barium phosphate, calcium nitrate, calcium hydroxide, calcium chloride, calcium acetate, calcium oxide, calcium bromide, calcium carbonate, calcium fluoride, calcium iodide, calcium sulfate, calcium phosphate, strontium nitrate, strontium hydroxide, strontium carbonate, strontium chloride, strontium acetate, strontium oxide, strontium bromide, strontium fluoride, strontium iodide, strontium sulfate and strontium phosphate.

Among them, barium nitrate, barium hydroxide, barium chloride, barium acetate, barium oxide, barium bromide, barium carbonate, barium fluoride, barium iodide, barium sulfate, barium phosphate, calcium nitrate and strontium nitrate are preferred.

These alkaline earth metal compounds may be used solely, or two or more of them may be used in combination.

The concentration of hydrogen peroxide contained in the cleaning solution of the present invention is 0.002 to 50% by mass, preferably 0.01 to 40% by mass, more preferably 0.01 to 30% by mass, even more preferably 0.1 to 30% by mass, and particularly preferably 0.5 to 25% by mass. When the concentration is within the above-described range, the dry etching residue can be effectively removed.

The alkali contained in the cleaning solution of the present invention is added for the purpose of adjusting pH. Therefore, the type of the alkali is not limited, and the alkali can be added at any concentration. The concentration of the alkali is preferably 0.1 to 20% by mass, more preferably 0.3 to 15% by mass, even more preferably 0.5 to 12% by mass, and particularly preferably 0.6 to 10.4% by mass. When the concentration is within the above-described range, corrosion of the tantalum-containing material can be effectively prevented. When the concentration exceeds 20% by mass, the low-k film may be damaged.

Examples of the alkali to be used in the present invention include, but are not limited to, potassium hydroxide, potassium acetate, potassium carbonate, potassium phosphate, ammonia, tetramethylammonium hydroxide, triethylamine, ethanolamine and 1-amino-2-propanol.

Among them, potassium hydroxide, ammonia and tetramethylammonium hydroxide are preferred.

These alkalis may be used solely, or two or more of them may be used in combination.

The pH value of the cleaning solution of the present invention may be 7 to 14. The pH value is preferably 7.5 to 14, more preferably 8 to 13.8, and even more preferably 8.5 to 13.5. When the pH value is within the above-described range, it is possible to suppress damage to the low-k film and the tantalum-containing material and selectively remove the photoresist and the dry etching residue on the surface of the product to be treated.

The water contained in the cleaning solution of the present invention is preferably water from which metal ions, organic impurities, particles, etc. have been removed by distillation, ion exchange treatment, filtering treatment, adsorption treatment or the like, and pure water and ultra-pure water are particularly preferred. In this regard, the concentration of water means the remaining portion of the cleaning solution from which agents are excluded.

In the cleaning solution of the present invention, if desired, an additive which is conventionally used in semiconductor cleaning solutions may be blended within a range in which the purpose of the present invention is not impaired. For example, as the additive, an acid, a metal anticorrosive, a water-soluble organic solvent, a fluorine compound, an oxidant, a reducing agent, a chelating agent, a surfactant, a defoaming agent, etc. may be added.

The temperature at which the cleaning solution of the present invention is used is 20 to 80° C., preferably 50 to 70° C., and may be appropriately selected depending on etching conditions and a semiconductor element to be used.

With the cleaning method of the present invention, ultrasonic may be used in combination according to need.

The time for use of the cleaning solution of the present invention is 0.3 to 120 minutes, preferably 0.5 to 60 minutes, and may be appropriately selected depending on etching conditions and a semiconductor element to be used.

As a rinse liquid to be used after use of the cleaning solution of the present invention, an organic solvent such as alcohol can be used, but it is sufficient to just rinse the semiconductor element with water.

As a general low-k film included in a semiconductor element to which the cleaning solution of the present invention is applied, a hydroxysilsesquioxane (HSQ)-based or methylsilsesquioxane (MSQ)-based OCD (trade name, manufactured by Tokyo Ohka Kogyo Co., Ltd.), a carbon-doped silicon oxide (SiOC)-based Black Diamond (trade name, manufactured by Applied Materials), Aurora (trade name, manufactured by ASM International), Coral (trade name, manufactured by Novellus Systems) and an inorganic Orion (trade name, manufactured by Trikon Tencnlogies) can be used, but the low-k film is not limited thereto.

The semiconductor element to which the cleaning solution of the present invention is applied may include a barrier insulating film and/or a hard mask.

EXAMPLES

Hereinafter, the present invention will be described in more detail based on Examples and Comparative Examples, but the present invention is not limited by the Examples.
Measurement of Tantalum Film Thickness:
The film thickness of a wafer with a film was measured by using X-Ray Fluorescent Analyzer SEA1200VX manufactured by SII Nano Technology Inc.
Measurement and Judgment of Etching Rate of Tantalum:
For evaluation of the etching rate of the tantalum-containing material, a wafer with a tantalum nitride film containing 30 atomic % of tantalum (manufactured by Advantech Co., Ltd.) was used. The value obtained by dividing the film thickness before and after the treatment of the wafer with the film using the cleaning solution by the treatment time was defined as the etching rate, and calculation was carried out.

The case where the etching rate was 4 Å/min or less is regarded as acceptable.
SEM Observation:
Observation of conditions before and after the cleaning/removal treatment of the semiconductor element was carried out using the below-described SEM (scanning electron microscope) apparatus (100,000×).

Measurement apparatus: ultra-high resolution field-emission scanning electron microscope SU9000 manufactured by Hitachi High-Technologies Corporation
Judgment:
I. Removal state of photoresist
  E: The photoresist was completely removed.
  G: The photoresist was almost removed.
  P: The photoresist was insufficiently removed.
  E and G are regarded as acceptable.
II. Removal state of dry etching residue
  E: The dry etching residue was completely removed.
  G: The dry etching residue was almost removed.
  P: The dry etching residue was insufficiently removed.
  E and G are regarded as acceptable.

III. Damage to low-k film

E: The low-k film showed no change compared to that prior to cleaning.

G: The low-k film showed slight change compared to that prior to cleaning.

P: The low-k film showed change in its shape.

E and G are regarded as acceptable.

Examples 1-11

A semiconductor element having a photoresist 2 and a low-k film 4, which has a wiring structure whose cross-sectional surface is as shown in FIG. 2, was used to examine cleaning effects for removing a dry etching residue 3. The semiconductor element was immersed in a cleaning solution shown in Table 1 at a temperature and for a period of time shown in Table 2. After that, rinsing with ultrapure water and drying by dry nitrogen gas jet were carried out. The semiconductor element after cleaning was observed by SEM to judge the removal state of the photoresist 2 and dry etching residue 3 (FIG. 2) and damage to the low-k film 4 (FIG. 2).

The above-described wafer with a film (manufactured by Advantech Co., Ltd.) as the tantalum-containing material was used to examine damage to the tantalum-containing material. It was immersed in a cleaning solution shown in Table 1 at a temperature and for a period of time shown in Table 2. After that, rinsing with ultrapure water and drying by dry nitrogen gas jet were carried out. The film thickness before and after immersion was obtained by using the above-described X-Ray Fluorescent Analyzer SEA1200VX, and the etching rate was calculated.

It is understood that in Examples 1-11 to which the cleaning solution of the present invention shown in Table 2 and the cleaning method using the same were applied, damage to the low-k film 4 was prevented while the photoresist 2 and dry etching residue 3 were completely removed. It is also understood that the etching rate of tantalum nitride is 4 Å/min or less and that damage to the tantalum-containing material is small.

Comparative Examples 1-7 (without Alkaline Earth Metal Compound)

The semiconductor element shown in FIG. 2 was cleaned with a cleaning solution (Table 3, cleaning solutions 2A and 2C to 2G) in which barium nitrate was not added in the cleaning solution used in Examples 1 and 3 to 7 (Table 1, cleaning solutions 1A and 1C to 1G). Further, the etching rate of tantalum nitride was measured. Cleaning conditions and results of cleaning are shown in Table 5. When compared to the cleaning solutions in which barium nitrate was added to the cleaning solutions 2A and 2C to 2G shown in Comparative Examples 1-7 (Table 1, cleaning solutions 1A and 1C to 1G), there was no difference of damage to the low-k film 4 and removability of the photoresist 2 and the dry etching residue 3 between them, but the etching rate of tantalum nitride was higher. Accordingly, in the process for manufacturing the semiconductor element that is the target of the present invention, the cleaning method using the cleaning solutions 2A and 2C to 2G can suppress damage to the low-k film and remove the photoresist and dry etching residue on the surface of the product to be treated, but significantly damages the tantalum-containing material, and therefore cannot be used for the purpose of the present application (Table 5). In addition, according to these and Examples 8-11, it is understood that the alkaline earth metal compound is useful for suppressing damage to the tantalum-containing material without deterioration of removability of the photoresist and dry etching residue.

Comparative Example 8 (the Invention Described in Patent Document 1)

The semiconductor element shown in FIG. 1 was cleaned with a cleaning solution containing 3.35% by mass of TMAH, 0.11% by mass of CyDTA, 1.64% by mass of hydrogen peroxide, 0.23% by mass of hexafluorosilicic acid and 94.67% by mass of water (Table 4, cleaning solution 2H). Cleaning conditions and evaluation results are shown in Table 5. When using this cleaning solution, the dry etching residue was successfully removed and the etching rate of tantalum nitride was low, but it was impossible to remove the photoresist and the low-k film was damaged. Accordingly, it is understood that the cleaning method using the cleaning solution 2H cannot be used for the purpose of suppressing damage to the tantalum-containing material and the low-k film and removing the photoresist and dry etching residue on the surface of the product to be treated in the process for manufacturing the semiconductor element that is the target of the present invention.

Comparative Example 9

The semiconductor element shown in FIG. 1 was cleaned with a cleaning solution containing 4.5% by mass of KOH, 0.01% by mass of hydrogen peroxide, 0.01% by mass of hexafluorosilicic acid and 95.48% by mass of water (Table 4, cleaning solution 2I). Cleaning conditions and evaluation results are shown in Table 5. When using the cleaning method using this cleaning solution, the photoresist and the dry etching residue were successfully removed, but the etching rate of tantalum nitride was high and the low-k film was damaged. Further, when compared to the cleaning solution containing 4.5% by mass of KOH, 0.01% by mass of hydrogen peroxide and 95.49% by mass of water used in the cleaning method of Comparative Example 3 (Table 4, cleaning solution 2C), the etching rate of tantalum nitride was nearly equal, and it is understood that the low-k film was damaged due to the addition of hexafluorosilicic acid. Accordingly, it is understood that the cleaning method using the cleaning solution 2I cannot be used for the purpose of suppressing damage to the tantalum-containing material and the low-k film and removing the photoresist and the dry etching residue on the surface of the product to be treated in the process for manufacturing the semiconductor element that is the target of the present invention.

TABLE 1

| Cleaning solution | pH | Hydrogen peroxide Concentration % by mass | Alkaline earth metal compound Type | Alkaline earth metal compound Concentration % by mass | Alkali Type | Alkali Concentration % by mass | Water Concentration % by mass |
|---|---|---|---|---|---|---|---|
| 1A | 7.9 | 30 | Barium nitrate | 0.1 | KOH | 1 | 68.9 |
| 1B | 7.9 | 30 | Barium nitrate | 0.2 | KOH | 1 | 68.8 |

TABLE 1-continued

| Cleaning solution | pH | Hydrogen peroxide Concentration % by mass | Alkaline earth metal compound Type | Concentration % by mass | Alkali Type | Concentration % by mass | Water Concentration % by mass |
|---|---|---|---|---|---|---|---|
| 1C | 13.8 | 0.01 | Barium nitrate | 0.003 | KOH | 4.5 | 95.487 |
| 1D | 9.9 | 6 | Barium nitrate | 0.005 | KOH | 0.6 | 93.395 |
| 1E | 10.8 | 3 | Barium nitrate | 0.05 | KOH | 1.2 | 95.75 |
| 1F | 9.8 | 18 | Barium nitrate | 0.1 | Ammonia | 3 | 78.9 |
| 1G | 13.6 | 6 | Barium nitrate | 0.005 | TMAH | 10.4 | 83.595 |
| 1H | 9.9 | 0.6 | Barium hydroxide | 0.0033 | KOH | 0.6 | 98.7967 |
| 1I | 9.9 | 0.6 | Barium chloride | 0.004 | KOH | 0.6 | 98.796 |
| 1J | 9.7 | 0.6 | Calcium sulfate | 0.02 | KOH | 0.6 | 98.78 |
| 1K | 9.8 | 0.6 | Strontium nitrate | 0.02 | KOH | 0.6 | 98.78 |

KOH: potassium hydroxide
TMAH: tetramethylammonium hydroxide

TABLE 2

| Examples | Cleaning solution | Temperature ° C. | Immersion time Min | Removal state I | Removal state II | Damage I | TaN ER Å/min |
|---|---|---|---|---|---|---|---|
| 1 | 1A | 60 | 20 | E | E | E | 3 |
| 2 | 1B | 60 | 60 | E | E | E | 2 |
| 3 | 1C | 70 | 30 | E | E | E | <1 |
| 4 | 1D | 70 | 30 | E | E | E | 2 |
| 5 | 1E | 70 | 0.5 | E | G | E | 4 |
| 6 | 1F | 60 | 30 | E | E | E | 2 |
| 7 | 1G | 70 | 30 | E | E | E | <1 |
| 8 | 1H | 70 | 60 | E | E | E | 2 |
| 9 | 1I | 70 | 60 | E | E | E | 2 |
| 10 | 1J | 70 | 60 | E | G | E | <1 |
| 11 | 1K | 70 | 60 | E | E | E | 1 |

Removal state I: removal state of photoresist 2
Removal state II: removal state of dry etching residue 3
Damage I: damage to low-k film 4
TaN ER: etching rate of tantalum nitride (damage to tantalum-containing material)

TABLE 3

| Cleaning solution | pH | Hydrogen peroxide Concentration % by mass | Alkaline earth metal compound Type | Concentration % by mass | Alkali Type | Concentration % by mass | Water Concentration % by mass |
|---|---|---|---|---|---|---|---|
| 2A | 8 | 30 | — | — | KOH | 1 | 69 |
| 2C | 13.8 | 0.01 | — | — | KOH | 4.5 | 95.49 |
| 2D | 9.9 | 6 | — | — | KOH | 0.6 | 93.4 |
| 2E | 10.8 | 3 | — | — | KOH | 1.2 | 95.8 |
| 2F | 9.8 | 18 | — | — | Ammonia | 3 | 79 |
| 2G | 13.7 | 6 | — | — | TMAH | 10.4 | 83.6 |

KOH: potassium hydroxide
TMAH: tetramethylammonium hydroxide

TABLE 4

| Cleaning solution | Composition of cleaning solution (concentration: % by mass) |
|---|---|
| 2H | TMAH: 3.35%, CyDTA: 0.11%, hydrogen peroxide: 1.64%, hexafluorosilicic acid: 0.23%, water: 94.67% |
| 2I | KOH: 4.5%, hydrogen peroxide: 0.01%, hexafluorosilicic acid: 0.01%, water: 95.48% |

TMAH: tetramethylammonium hydroxide
CyDTA: trans-1,2-diaminocyclohexane-N,N,N',N'-tetraacetic acid monohydrate
KOH: potassium hydroxide

TABLE 5

| Comparative Examples | Cleaning solution | Temperature °C. | Immersion time Min | Removal state I | Removal state II | Damage I | TaN ER Å/min |
|---|---|---|---|---|---|---|---|
| 1 | 2A | 60 | 20 | E | E | E | 31 |
| 2 | 2A | 60 | 60 | E | E | E | 28 |
| 3 | 2C | 70 | 30 | E | E | E | 19 |
| 4 | 2D | 70 | 30 | E | E | E | 30 |
| 5 | 2E | 70 | 0.5 | E | G | E | 29 |
| 6 | 2F | 60 | 30 | E | E | E | 27 |
| 7 | 2G | 70 | 30 | E | E | E | 19 |
| 8 | 2H | 40 | 0.5 | P | E | P | <1 |
| 9 | 2I | 70 | 30 | E | E | P | 22 |

Removal state I: removal state of photoresist 2
Removal state II: removal state of dry etching residue 3
Damage I: damage to low-k film 4
TaN ER: etching rate of tantalum nitride (damage to tantalum-containing material)

INDUSTRIAL APPLICABILITY

When using the cleaning solution and the cleaning method of the present invention, in the process for manufacturing the semiconductor element, damage to the tantalum-containing material and the low-k film can be suppressed, the photoresist and the dry etching residue on the surface of the product to be treated can be removed, the semiconductor element having high precision and high quality can be produced with a high yield, and therefore these are industrially useful.

EXPLANATIONS OF LETTERS OR NUMERALS

1: tantalum-containing material
2: photoresist
3: dry etching residue
4: low-k film
5: copper

The invention claimed is:

1. A cleaning method for removing a photoresist and dry etching residue on a surface of a semiconductor element comprising a low-k film and a material that comprises 10 atomic % or more of tantalum, said cleaning method comprising contacting said semiconductor element with a cleaning solution comprising 0.002 to 50% by mass of hydrogen peroxide, 0.001 to 1% by mass of an alkaline earth metal compound, an alkali, and water, wherein a pH value of the cleaning solution is 8 to 13.8.

2. The cleaning method according to claim 1, wherein the material that comprises 10 atomic % or more of tantalum is at least one substance selected from the group consisting of tantalum oxide, tantalum nitride and tantalum.

3. The cleaning method according to claim 1, wherein the alkaline earth metal compound is at least one selected from the group consisting of a calcium compound, a strontium compound and a barium compound.

4. The cleaning method according to claim 1, wherein a content of the alkali is 0.1 to 20% by mass.

5. The cleaning method according to claim 1, wherein the alkali is at least one selected from the group consisting of potassium hydroxide, potassium acetate, potassium carbonate, potassium phosphate, ammonia, tetramethylammonium hydroxide, triethylamine, ethanolamine and 1-amino-2-propanol.

6. A cleaning solution which comprises 0.002 to 50% by mass of hydrogen peroxide, 0.001 to 1% by mass of an alkaline earth metal compound, an alkali, and water, wherein a pH value of the cleaning solution is 8 to 13.8.

7. The cleaning solution according to claim 6, wherein the alkaline earth metal compound is at least one selected from the group consisting of a calcium compound, a strontium compound and a barium compound.

8. The cleaning solution according to claim 6, wherein a content of the alkali is 0.1 to 20% by mass.

9. The cleaning solution according to claim 6, wherein the alkali is at least one selected from the group consisting of potassium hydroxide, potassium acetate, potassium carbonate, potassium phosphate, ammonia, tetramethylammonium hydroxide, triethylamine, ethanolamine and 1-amino-2-propanol.

10. The cleaning method according to claim 1, wherein a pH value of the cleaning solution is 8.5 to 13.5.

11. The cleaning method according to claim 1, wherein said cleaning solution comprises 0.1 to 50% by mass of said hydrogen peroxide, 0.003 to 1% by mass of said alkaline earth metal compound, and a content of said alkali is 0.5 to 20% by mass.

12. The cleaning method according to claim 1, wherein the material that contains 10 atomic % or more of tantalum is at least one substance selected from the group consisting of tantalum oxide, tantalum nitride and tantalum, the alkaline earth metal compound is at least one selected from the group consisting of a calcium compound, a strontium compound and a barium compound, and the alkali is at least one selected from the group consisting of potassium hydroxide, potassium acetate, potassium carbonate, potassium phosphate, ammonia, tetramethylammonium hydroxide, triethylamine, ethanolamine and 1-amino-2-propanol.

13. The cleaning method according to claim 1, wherein the cleaning solution is contacted with said semiconductor element at a temperature of 20 to 80° C. for a time period of 0.3 to 120 minutes.

14. The cleaning solution according to claim 6, wherein a pH value of the cleaning solution is 8.5 to 13.5.

15. The cleaning solution according to claim 6, wherein said cleaning solution comprises 0.1 to 50% by mass of said hydrogen peroxide, 0.003 to 1% by mass of said alkaline earth metal compound, and a content of said alkali is 0.5 to 20% by mass.

16. The cleaning solution according to claim 6, wherein the alkaline earth metal compound is at least one selected from the group consisting of a calcium compound, a strontium compound and a barium compound, and the alkali is at least one selected from the group consisting of potassium hydroxide, potassium acetate, potassium carbonate, potassium phosphate, ammonia, tetramethylammonium hydroxide, triethylamine, ethanolamine and 1-amino-2-propanol.

* * * * *